(12) United States Patent
Wieland et al.

(10) Patent No.: US 8,841,636 B2
(45) Date of Patent: Sep. 23, 2014

(54) MODULATION DEVICE AND CHARGED PARTICLE MULTI-BEAMLET LITHOGRAPHY SYSTEM USING THE SAME

(75) Inventors: Marco Jan-Jaco Wieland, Delft (NL); Remco Jager, Rotterdam (NL); Alexander Hendrik Vincent Van Veen, Rotterdam (NL); Stijn Willem Herman Karel Steenbrink, The Hague (NL)

(73) Assignee: Mapper Lithography IP B.V., Delft (NL)

( * ) Notice: Subject to any disclaimer, the term of this patent is extended or adjusted under 35 U.S.C. 154(b) by 777 days.

(21) Appl. No.: 12/911,859

(22) Filed: Oct. 26, 2010

(65) Prior Publication Data

US 2011/0261340 A1 Oct. 27, 2011

Related U.S. Application Data

(60) Provisional application No. 61/254,779, filed on Oct. 26, 2009.

(51) Int. Cl.
| | |
|---|---|
| *H01J 37/317* | (2006.01) |
| *H01J 37/04* | (2006.01) |
| *B82Y 40/00* | (2011.01) |
| *B82Y 10/00* | (2011.01) |
| *H01J 37/07* | (2006.01) |

(52) U.S. Cl.
CPC ..... *H01J 37/3177* (2013.01); *H01J 2237/0435* (2013.01); *B82Y 40/00* (2013.01); *H01J 2237/0262* (2013.01); *H01J 2237/31722* (2013.01); *H01J 2237/31774* (2013.01); *B82Y 10/00* (2013.01); *H01J 37/07* (2013.01); *H01J 37/045* (2013.01); *H01J 2237/0437* (2013.01); *H01J 37/3174* (2013.01)
USPC .................................. 250/492.2; 250/396 R (58) Field of Classification Search
CPC ......... H01J 37/04; H01J 37/045; H01J 37/07; H01J 37/317; H01J 37/3177; H01J 2237/026; H01J 2237/0262; H01J 2237/043; H01J 2237/0435; H01J 2237/31715; H01J 2237/31722; H01J 2237/31774
See application file for complete search history.

(56) References Cited

U.S. PATENT DOCUMENTS

| 6,958,804 B2 | 10/2005 | Wieland | |
|---|---|---|---|
| 8,492,731 B2 * | 7/2013 | Wieland et al. ........... | 250/396 R |

(Continued)

FOREIGN PATENT DOCUMENTS

| JP | 2005123264 A | 5/2005 |
|---|---|---|
| JP | 2006 210460 A2 | 8/2006 |

(Continued)

OTHER PUBLICATIONS

International Search Report for PCT/EP2010/066198 (issued Feb. 17, 2011).

*Primary Examiner* — Jack Berman
(74) *Attorney, Agent, or Firm* — Hoyng Monegier LLP; David P. Owen; Minerva Rivero (57) ABSTRACT

The invention relates to a charged-particle multi-beamlet lithography system for transferring a pattern onto the surface of a target. The system includes a beam generator, a beamlet blanker array, a shielding structure and a projection system. The beam generator is arranged for generating a plurality of charged particle beamlets. The beamlet blanker array is arranged for patterning the beamlets. The beamlet blanker array comprises a plurality of modulators and a plurality of light sensitive elements. The light sensitive elements are arranged to receive pattern data carrying light beams and are electrically connected to one or more modulators. The shielding structure is of an electrically conductive material for substantially shielding electric fields generated in proximity of the light sensitive elements from the modulators. The shielding structure is arranged to be set at a predetermined potential. The projection system is arranged for projecting the patterned beamlets onto the target surface.

23 Claims, 8 Drawing Sheets

(56) References Cited

U.S. PATENT DOCUMENTS

| | | |
|---|---|---|
| 8,604,411 B2 * | 12/2013 | Wieland et al. ............... 250/216 |
| 2003/0183778 A1 | 10/2003 | Haraguchi |
| 2004/0135983 A1 | 7/2004 | Wieland |
| 2004/0169147 A1 | 9/2004 | Ono et al. |
| 2012/0145931 A1 * | 6/2012 | Van Melle et al. ....... 250/559.01 |
| 2012/0273658 A1 * | 11/2012 | Wieland et al. ............ 250/208.2 |

FOREIGN PATENT DOCUMENTS

| | | |
|---|---|---|
| JP | 2007019242 A | 1/2007 |
| JP | 2007019248 A | 1/2007 |

* cited by examiner

MODULATION DEVICE AND CHARGED PARTICLE MULTI-BEAMLET LITHOGRAPHY SYSTEM USING THE SAME

BACKGROUND OF THE INVENTION

1. Field of the Invention

The invention relates to a modulation device for use in a charged particle multi-beamlet lithography system. The invention further relates to a charged-particle multi-beamlet lithography system. Finally, the invention relates to a method of modulating charged particle beamlets in a charged-particle multi-beamlet lithography system for transferring a pattern to a target surface.

2. Description of the Related Art

Charged particle multi-beamlet systems are known in the art, for example from U.S. Pat. No. 6,958,804 in the name of the applicant. Such lithography system uses a plurality of charged particle beamlets to transfer a pattern to a target surface. The system may operate with a continuous radiation source or with a source operating at constant frequency. Pattern data are sent to a modulation device arranged to modulate the beamlets by electrostatic deflection. The modulated beamlets are then transferred to the target surface. Generally, during this transfer the diameter of the individual beamlets is reduced. Furthermore, the position of the beamlets with respect to the target surface changes over time, for example due to electrostatic scanning of beamlets and/or movement of the target surface relative to the optical column through which the beamlets are transferred with respect to each other. For example, such relative movement may be established by mechanical movement using a stage provided with a support structure for holding the target. In order to enable a high speed transfer of the pattern to the target surface, optical transmission of pattern data from the control unit to the modulators may be used, for example by using light beams. The modulation device may then include light sensitive elements capable of converting received light signals into corresponding electric signals.

Patterning with a system as described above may suffer from inconsistent pattern transfer due to perturbated modulation of the beamlets. Experiments have shown that the extent of such perturbation is highly unpredictable. As a result, pattern transfer onto a target surface using such system is less reliable than desired.

BRIEF SUMMARY OF THE INVENTION

It is therefore an object of the present invention to improve the reliability of pattern transfer onto a target surface using a charged particle multi-beamlet lithography system. This object has been achieved by providing a charged-particle multi-beamlet lithography system for transferring a pattern onto the surface of a target using a plurality of charged particle beamlets, the system comprising: a beam generator for generating a plurality of charged particle beamlets; a beamlet blanker array for patterning the plurality of beamlets in accordance with a pattern; wherein the beamlet blanker array comprises a plurality of modulators and a plurality of light sensitive elements, the light sensitive elements being arranged to receive pattern data carrying light beams and to convert the light beams into electrical signals, the light sensitive element being electrically connected to one or more modulators for providing the received pattern data to the one or more modulators; a shielding structure for substantially shielding electric fields generated in proximity to the light sensitive elements from the modulators; and a projection system for projecting the patterned beamlets onto the target surface.

The present invention is based on the insight that shielding electric and/or magnetic fields originating from charged particle source in the vicinity of the light sensitive elements greatly reduce possible distortions and lead to an improved performance of charged particle lithography.

The invention further relates to a modulation device for use in a charged-particle multi-beamlet lithography system, the modulation device comprising: a beamlet blanker array for patterning a plurality of beamlets in accordance with a pattern, wherein the beamlet blanker array comprising a plurality of modulators and a plurality of light sensitive elements, the light sensitive elements being arranged to receive pattern data carrying light beams and being electrically connected to one or more modulators for providing the received pattern data, and the modulators being arranged to modulate charged particle beamlets in accordance with the received pattern data; and a shielding structure of an electrically conductive material for substantially shielding electric fields generated in proximity to the light sensitive elements from the modulators, wherein the shielding structure is arranged to be set at a predetermined potential.

The invention further relates to a method of modulating charged particle beamlets in a charged-particle multi-beamlet lithography system for transferring a pattern to a target surface, the method comprising: providing a beamlet blanker array comprising a plurality of modulators and a plurality of light sensitive elements, the light sensitive elements being arranged to receive pattern data carrying light beams and being electrically connected to one or more modulators for providing the received pattern data, and the modulators a comprising a first electrode, a second electrode and an aperture, wherein the electrodes are located on opposing sides of the apertures for generating an electric field across the aperture; and modulating beamlets passing through the in accordance with the received pattern data. The method includes transmitting pattern data to the beamlet blanker array, modulating beamlets passing through the beamlet blanker array in accordance with the pattern data, and shielding the electric fields for modulating the beamlets from electric fields generated in proximity to the light sensitive elements. In this way, the beamlet modulation is carried out using an electric field substantially free of contributions generated in proximity to the light sensitive elements.

BRIEF DESCRIPTION OF THE DRAWINGS

Various aspects of the invention will be further explained with reference to embodiments shown in the drawings wherein.

DESCRIPTION OF ILLUSTRATIVE EMBODIMENTS

The following is a description of various embodiments of the invention, given by way of example only and with reference to the figures. The figures are not drawn to scale and merely intended for illustrative purposes.

Figure 1:
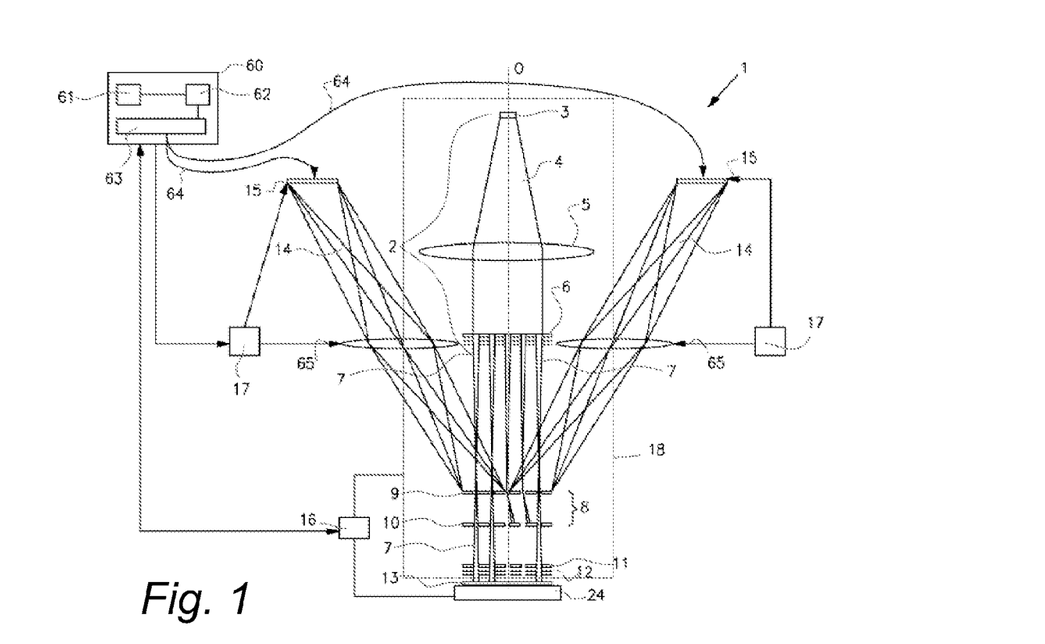
FIG. 1 schematically shows a maskless lithography system that may be used in embodiments of the inventions.

FIG. 1 shows a simplified schematic drawing of an embodiment of a charged particle multi-beamlet lithography system 1. Such lithography system is for example described in U.S. Pat. Nos. 6,897,458 and 6, 958,804 and 7.084,414 and 7,129, 502, which are assigned to the applicant of the present application and which are hereby incorporated by reference in their entirety.

Such lithography system 1 suitably comprises a beamlet generator generating a plurality of beamlets, a beamlet modulator patterning the beamlets to form modulated beamlets, and a beamlet projector for projecting the modulated beamlets onto a surface of a target.

The beamlet generator typically comprises a source and at least one beam splitter. The source in FIG. 1 is an electron source 3 arranged to produce a substantially homogeneous, expanding electron beam 4. The beam energy of the electron beam 4 is preferably maintained relatively low in the range of about 1 to 10 keV. To achieve this, the acceleration voltage is preferably low, and the electron source 3 may be kept at a voltage between about −1 to −10 kV with respect to the target at ground potential, although other settings may also be used.

In FIG. 1 the electron beam 4 from the electron source 3 passes a collimator lens 5 for collimating the electron beam 4. The collimator lens 5 may be any type of collimating optical system. Before collimation, the electron beam 4 may pass a double octopole (not shown). Subsequently, the electron beam 4 impinges on a beam splitter, in the embodiment of FIG. 1 an aperture array 6. The aperture array 6 preferably comprises a plate having through-holes. The aperture array 6 is arranged to block part of the beam 4. Additionally, the array 6 allows a plurality of beamlets 7 to pass through so as to produce a plurality of parallel electron beamlets 7.

The lithography system 1 of FIG. 1 generates a large number of beamlets 7, preferably about 10,000 to 1,000,000 beamlets, although it is of course possible that more or less beamlets are generated. Note that other known methods may also be used to generate collimated beamlets. A second aperture array may be added in the system, so as to create subbeams from the electron beam 4 and to create electron beamlets 7 from the subbeam. This allows for manipulation of the subbeams further downstream, which turns out beneficial for the system operation, particularly when the number of beamlets in the system is 5,000 or more.

The beamlet modulator, denoted in FIG. 1 as modulation system 8, typically comprises a beamlet blanker array 9 comprising an arrangement of a plurality of blankers, and a beamlet stop array 10. The blankers are capable of deflecting one or more of the electron beamlets 7. In embodiments of the invention, the blankers are more specifically electrostatic deflectors provided with a first electrode, a second electrode and an aperture. The electrodes are then located on opposing sides of the aperture for generating an electric field across the aperture. Generally, the second electrode is a ground electrode, i.e. an electrode connected to ground potential.

To focus the electron beamlets 7 within the plane of the blanker array 9 the lithography system may further comprise a condenser lens array (not shown).

In the embodiment of FIG. 1, the beamlet stop array 10 comprises an array of apertures for allowing beamlets to pass through. The beamlet stop array 10, in its basic form, comprises a substrate provided with through-holes, typically round holes although other shapes may also be used. In some embodiments, the substrate of the beamlet stop array 10 is formed from a silicon wafer with a regularly spaced array of through-holes, and may be coated with a surface layer of a metal to prevent surface charging. In some further embodiments, the metal is of a type that does not form a native-oxide skin, such as CrMo.

The beamlet blanker array 9 and the beamlet stop array 10 operate together to block or let pass the beamlets 7. In some embodiments, the apertures of the beamlet stop array 10 are aligned with the apertures of the electrostatic deflectors in the beamlet blanker array 9. If beamlet blanker array 9 deflects a beamlet, it will not pass through the corresponding aperture in the beamlet stop array 10. Instead the beamlet will be blocked by the substrate of beamlet block array 10. If beamlet blanker array 9 does not deflect a beamlet, the beamlet will pass through the corresponding aperture in the beamlet stop array 10. In some alternative embodiments, cooperation between the beamlet blanker array 9 and the beamlet stop array 10 is such that deflection of a beamlet by a deflector in the blanker array 9 results in passage of the beamlet through the corresponding aperture in the beamlet stop array 10, while non-deflection results in blockage by the substrate of the beamlet stop array 10.

The modulation system 8 is arranged to add a pattern to the beamlets 7 on the basis of input provided by a control unit 60. The control unit 60 may comprise a data storage unit 61, a read out unit 62 and data converter 63. The control unit 60 may be located remote from the rest of the system, for instance outside the inner part of a clean room. Using optical fibers 64, modulated light beams 14 holding pattern data may be transmitted to a projector 65 which projects light from the ends of fibers within a fiber array (schematically depicted as plate 15) into the electron optical portion of the lithography system 1, schematically denoted by the dashed box and reference number 18.

In the embodiment of FIG. 1, the modulated light beams are projected on to the beamlet blanker array 9. More particularly, the modulated light beams 14 from optical fiber ends are projected on corresponding light sensitive elements located on the beamlet blanker array 9. The light sensitive elements may be arranged to convert the light signal into a different type of signal, for example an electric signal. A modulated light beam 14 carries a portion of the pattern data for controlling one or more blankers that are coupled to a corresponding light sensitive element. Suitably, in order to project the light beams 14 onto corresponding light sensitive elements optical elements such as a projector 65 may be used. Additionally, to allow projection of the light beams 14 at a suitable incident angle, a mirror may be included, for example suitably placed between a projector 65 and the beamlet blanker array 9. The projector 65 may be appropriately aligned with the plate 15 by a projector positioning device 17 under control of the control unit 60. As a result, the distance between the projector 65 and the light sensitive elements within the light sensitive element may vary as well.

In some embodiments, the light beams may, at least partially, be transferred from the plate towards the light sensitive elements by means of an optical waveguide. The optical waveguide may guide the light to a position very close to the light sensitive elements, suitably less than a centimeter, preferably in the order of a millimeter away. A short distance between an optical waveguide and a corresponding light sensitive elements reduces light loss. On the other hand, the use of plate 15 and a projector 65 located away from the space that may be occupied by the charged particle beamlets has the advantage that the beamlet disturbance is minimized, and the construction of the beamlet blanker array 9 is less complex.

The modulated beamlets coming out of the beamlet modulator are projected as a spot onto a target surface 13 of a target 24 by the beamlet projector. The beamlet projector typically comprises a scanning deflector for scanning the modulated beamlets over the target surface 13 and a projection lens system for focusing the modulated beamlets onto the target surface 13. These components may be present within a single end module.

Such end module is preferably constructed as an insertable, replaceable unit. The end module may thus comprise a deflector array 11, and a projection lens arrangement 12. The insertable, replaceable unit may also include the beamlet stop array 10 as discussed above with reference to the beamlet modulator. After leaving the end module, the beamlets 7 impinge on a target surface 13 positioned at a target plane. For lithography applications, the target usually comprises a wafer provided with a charged-particle sensitive layer or resist layer.

The deflector array 11 may take the form of a scanning deflector array arranged to deflect each beamlet 7 that passed the beamlet stop array 10. The deflector array 11 may comprise a plurality of electrostatic deflectors enabling the application of relatively small driving voltages. Although the deflector array 11 is drawn upstream of the projection lens arrangement 12, the deflector array 11 may also be positioned between the projection lens arrangement 12 and the target surface 13.

The projection lens arrangement 12 is arranged to focus the beamlets 7, before or after deflection by the deflector array 11. Preferably, the focusing results a geometric spot size of about 10 to 30 nanometers in diameter. In such preferred embodiment, the projection lens arrangement 12 is preferably arranged to provide a demagnification of about 100 to 500 times, most preferably as large as possible, e.g. in the range 300 to 500 times. In this preferred embodiment, the projection lens arrangement 12 may be advantageously located close to the target surface 13.

In some embodiments, a beam protector (not shown) may be located between the target surface 13 and the projection lens arrangement 12. The beam protector may be a foil or a plate provided with a plurality of suitably positioned apertures. The beam protector is arranged to absorb the released resist particles before they can reach any of the sensitive elements in the lithography system 1.

The projection lens arrangement 12 may thus ensure that the spot size of a single pixel on the target surface 13 is correct, while the deflector array 11 may ensure by appropriate scanning operations that the position of a pixel on the target surface 13 is correct on a microscale. Particularly, the operation of the deflector array 11 is such that a pixel fits into a grid of pixels which ultimately constitutes the pattern on the target surface 13. It will be understood that the macroscale positioning of the pixel on the target surface 13 is suitably enabled by a wafer positioning system present below the target 24.

Commonly, the target surface 13 comprises a resist film on top of a substrate. Portions of the resist film will be chemically modified by application of the beamlets of charged particles, i.e. electrons. As a result thereof, the irradiated portion of the film will be more or less soluble in a developer, resulting in a resist pattern on a wafer. The resist pattern on the wafer can subsequently be transferred to an underlying layer, i.e. by implementation, etching and/or deposition steps as known in the art of semiconductor manufacturing. Evidently, if the irradiation is not uniform, the resist may not be developed in a uniform manner, leading to mistakes in the pattern. High-quality projection is therefore relevant to obtain a lithography system that provides a reproducible result. No difference in irradiation ought to result from deflection steps.

Figure 2:
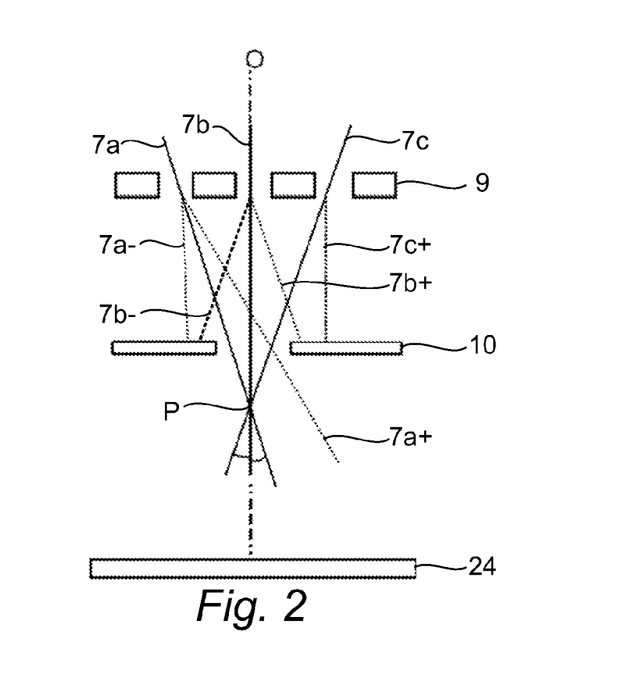
FIG. 2 schematically shows the operation of an embodiment of the beamlet blanker array in the lithography system of FIG. 1.

FIG. 2 schematically shows the operation of an embodiment of the beamlet blanker array 9 in the lithography system of FIG. 1. In particular, FIG. 2 schematically shows a cross-sectional view of a portion of a beamlet modulator comprising a beamlet blanker array 9 and beamlet stop array 10. The beamlet blanker array 9 is provided with a plurality of apertures. For sake of reference the target 24 has also been indicated. The figure is not drawn to scale.

The shown portion of the beamlet modulator is arranged to modulate three beamlets 7a, 7b, and 7c. The beamlets 7a, 7b, 7c may form part of a single group of beamlets that may be generated from a beam originating from a single source or from a single subbeam. The beamlet modulator of FIG. 2 is arranged for converging groups of beamlets towards a common point of convergence P for each group. This common point of convergence P is preferably located on an optical axis O for the group of beamlets.

Considering the shown beamlets 7a, 7b, 7c in FIG. 2, beamlets 7a, 7c have an incident angle extending between the beamlet and the optical axis O. The orientation of beamlet 7b is substantially parallel to the optical axis. The direction of beamlet deflection to establish blocking of deflected beamlets by the substrate of the beamlet stop array 10 may be different for each beamlet. Beamlet 7a is blocked by deflection towards the left, i.e. towards the "−"-direction in FIG. 2, indicated by dashed line 7a−. Beamlets 7b, 7c on the other hand are to be deflected towards the right, i.e. towards the "+"-direction, to established blocking of the respective beamlets. These blocking directions are indicated by dashed lines 7b+ and 7c+ respectively. Note that the choice of deflection direction may not be arbitrary. For example, for beamlet 7a, dashed line 7a+ shows that deflection of beamlet 7a towards the right would result in passage through the beamlet stop array 10. Therefore, deflection of beamlet 7a along line 7a+ would be inappropriate. On the other hand, deflection of beamlet 7b towards the left, indicated by dashed line 7b−, would be an option.

Figure 3A:
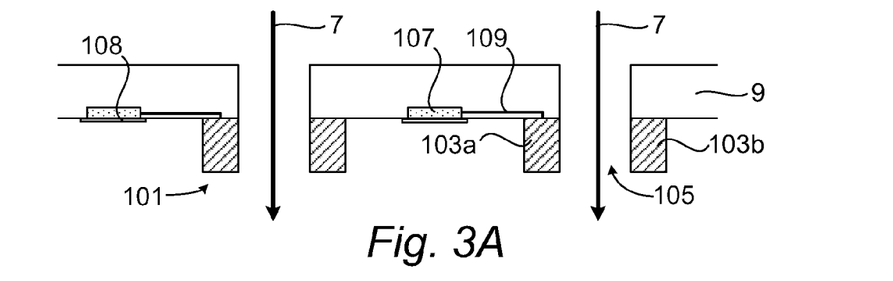
FIG. 3A schematically shows a cross-sectional view of a portion of a beamlet blanker array that may be used in the lithography system of FIG. 1.

FIG. 3A schematically shows a cross-sectional view of a portion of a beamlet blanker array 9 that may be used in the lithography system of FIG. 1. The beamlet blanker array 9 comprises a plurality of modulators 101. A modulator comprises a first electrode 103a, a second electrode 103b, and an aperture 105. The electrodes 103a, 103b are located on opposing sides of the aperture 105 for generating an electric field across the aperture.

A light sensitive element 107 is arranged to receive pattern data carrying light beams (not shown). The light sensitive element 107 is electrically connected to one or more modulators 101 via an electrical connection 109. The light sensitive element 107 receives pattern data via the light beams, converts the light signal into an electrical signal and then forwards the received and converted pattern data via the electrical connection 109 towards the one or more connected modulators 101. The one or more modulators 101 then modulate passing charged particle beamlets, such as electron beamlets 7 in accordance with the received pattern data. The light sensitive element 107 may be provided with an anti-reflection coating 108 to reduce background radiation caused by reflected light, which may disturb a correct readout of the data carried by the light beam.

Figure 3B:
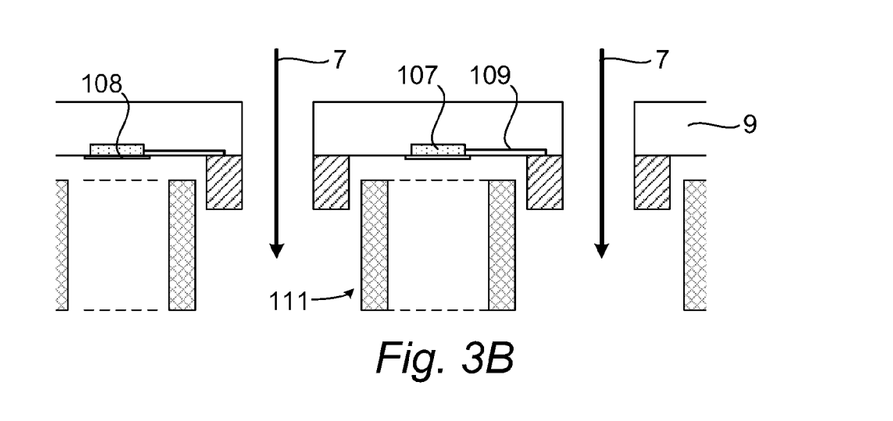
FIG. 3B schematically shows a cross-sectional view of a portion of a beamlet blanker array provided with a shielding structure according to an embodiment of the invention.

Modulation of the beamlets is thus based on controlling the application of an electric field across the apertures within the beamlet blanker array 9. However, practical use of a lithography system such as the one presented in FIG. 1 shows that effective modulation is not always possible. It turns out that the light sensitive elements 107 may act as electric field sources due to a collection of scattered electrons on their surface. This may particularly be the case if a anti-reflection coating such as coating 108 in FIGS. 3A, 3B is used. The anti-reflection coating is generally electrically insulating, which results in a relatively fast collection of scattered charged particles. Additionally, components that are used to transfer the light towards the light sensitive elements, for example optical fibers, may collect charged particles as well, in particular if they are not completely coated with a conductive coating.

The strength of electric fields caused by local collection of scattered charged particles generally depends on statistical parameters and other uncontrollable actors. Therefore, it is very difficult to predict how large the fields will be and where they will be located exactly. Experiments have shown that electric fields originating from a collection of scattered electrons can have a significant influence on position of a charged particle beamlet. This means that the beamlet position can be unstable. Furthermore, the extent of charged particle beamlet deflection may become unpredictable as well. As a result, the patterned beamlets obtained by modulation with the beamlet blanker array may not transfer a pattern that corresponds with the pattern provided to the beamlet blanker array 9 via the pattern data carrying light beams.

FIG. 3B schematically shows a cross-sectional view of a portion of a beamlet blanker array 9 provided with a shielding structure 111 according to an embodiment of the invention. The shielding structure 111 is an electrically conductive structure, and is arranged to shield electric fields and/or magnetic fields generated in proximity of the light sensitive elements 107, for example on top of an electrically insulating layer that may cover the light sensitive elements 107 for protection and/or anti-reflection purposes, from the modulators 105. In the remainder of this specification references to the expression "electric field" should be understood to mean electric and/or magnetic field.

The shielding structure 111 reduces, and preferably eliminates, the interfering of additional electric fields with the fields generated by the modulators 101. The reduction or elimination of electric field interference results in more accurate and robust modulation of the charged particle beamlets 7 by the modulators 101. The shielding structure 111 is kept at a predetermined electric potential. Preferably, the shielding structure 111 is connected to ground potential.

As can be seen in FIG. 3B, the shielding structure is not necessarily in contact with the beamlet blanker array 9. The purpose of the shielding structure 111 is to stop the electric fields generated in proximity of the light sensitive elements 107. Note that a fixed connection of the shielding structure 111 with the beamlet blanker array 9 is not essential to achieve such purpose.

Figure 3C:
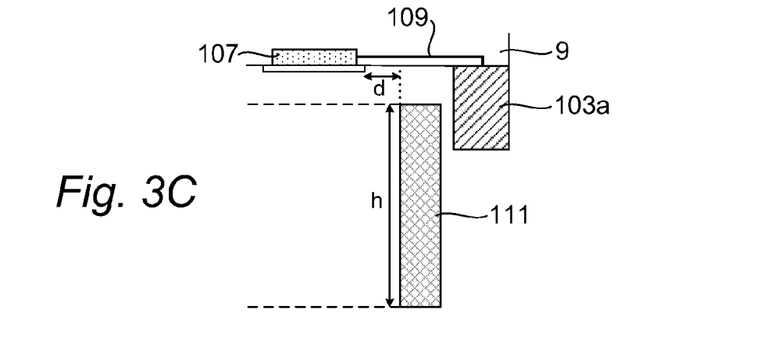
FIG. 3C schematically shows a cross-sectional view of a portion of the blanker array of FIG. 3B.

FIG. 3C schematically shows a cross-sectional view of a portion of the blanker array of FIG. 3B. In particular, FIG. 3C illustrates the ratio between the height h of the shielding structure 111 and the distance d between a light sensitive element 107 and the perpendicular projection of the shielding structure 111 onto the beamlet blanker array 9. The distance d will hereinafter be referred to as lateral shielding distance. Preferably, the height h is at least about the same as the lateral shielding distance d. Such dimensions allow to effectively shield the electric fields generated in proximity of the light sensitive elements. In particular if the height h is more than about 2.5 times the lateral shielding distance d, the influence of electric fields generated in proximity of the light sensitive elements on the operation of the modulators is negligible.

Figure 4:
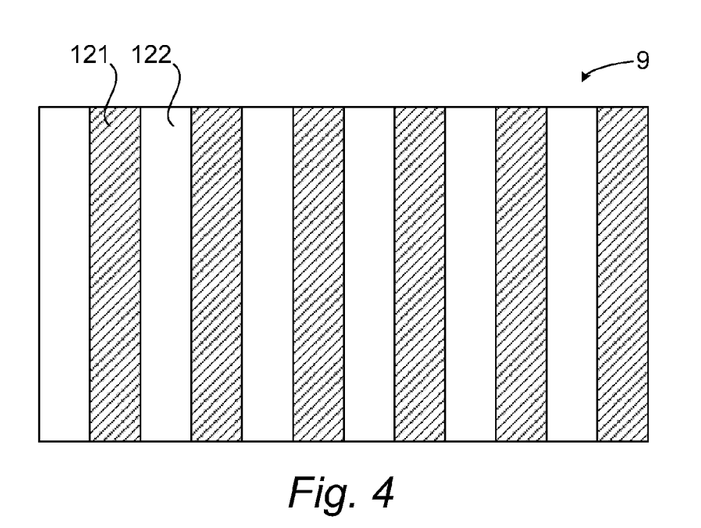
FIG. 4 schematically shows a top view of a lay-out of a beamlet blanker array that may be used in embodiments of the invention.

FIG. 4 schematically shows a top view of a lay-out of a beamlet blanker array 9 that may be used in embodiments of the invention. The beamlet blanker array 9 shown in FIG. 4 is divided into beam areas 121 and non-beam areas 122. Although the width of the beam areas 121 and non-beam areas 122 are shown to be about the same, this is not essential. The dimensions of the areas may differ based on the layout used.

The beam areas 121 include one or more modulators for modulating beamlets. The non-beam areas 122 include one or more light sensitive elements. The use of beam areas 121 and non-beam areas 122 in an optical column in a maskless lithography system has the advantage that the density of modulators and light sensitive area can be increased.

Figure 5:
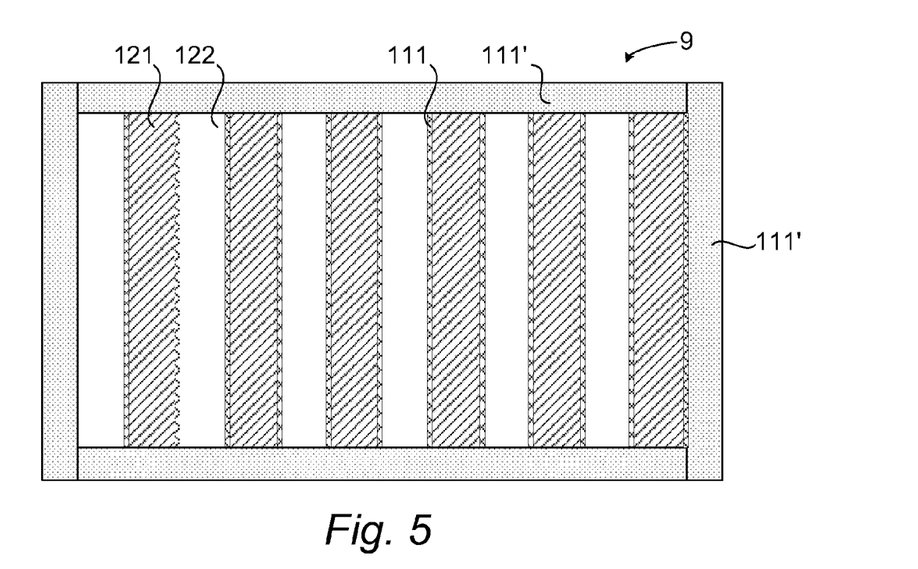
FIG. 5 schematically shows the beamlet blanker array of FIG. 3 provided with a shielding structure according to an embodiment of the invention.

FIG. 5 schematically shows the beamlet blanker array of FIG. 4 provided with a shielding structure 111 according to an embodiment of the invention. The shielding structure 111, that is at least its projection in a direction substantially perpendicular to the beamlet blanker array surface, is located between the light sensitive elements within the non-beam areas 122 and the modulators within the beam areas 121. The shielding structure 111 is arranged to substantially shield electric fields generated in proximity of the light sensitive elements.

The shielding structure 111 of FIG. 5 can be described as comprising side walls forming an open-ended box-like structure. The side walls may be integrated into a single body, for example by connection to an additional structure 111'. A single body has the benefit of an increased mechanical robustness. Furthermore, the structure 111, 111' may be handled more easily. Integration of different components to form the shielding structure 111, 111' may be executed by adding the portions 111' to the separate walls forming the functional shielding structure 111, for example by welding. Alternatively, the shielding structure may be manufactured out of one piece, for example by using techniques such as electrical discharge machining. Yet another way of creating an integrated shielding structure 111, 111' is to attach different components to a supporting substrate. This substrate may be the beamlet blanker array 9 or a component thereof, but may also be a separate suitable substrate.

The shielding structure 111 is not necessarily physically connected to the beamlet blanker array 9. If located within sufficiently close distance of the beamlet blanker array 9 the shielding structure 111 can still sufficiently shield electric fields.

In the embodiment shown in FIG. 5, the shielding structure 111 further includes a portion 111'. This additional portion 111' can provide mechanical support to the shielding structure 111. In some embodiments, the additional portion 111' is arranged to shield electric and/or magnetic fields originating from other potentially disturbing electric field generating sources, such as electricity cables.

Materials suitable for the shielding structure 111 are materials with sufficiently high electric conductivity. Additionally, the material should have sufficient strength and workability. An exemplary suitable material for use as main component of the shielding structure is titanium (Ti). Other exemplary materials that may be used include molybdenum (Mo) and aluminum (Al). In an exemplary embodiment, the shielding structure is made using Ti-plates coated with Mo. In another exemplary embodiment the shielding structure includes a stack of Mo sheets with Al spacers.

As discussed with reference to FIG. 1, light beams may be directed towards the light sensitive elements by using an optical fiber array. In some embodiments, it is advantageous to keep the distance between the fiber array and the light sensitive elements relatively short to reduce light losses.

Figure 6A:
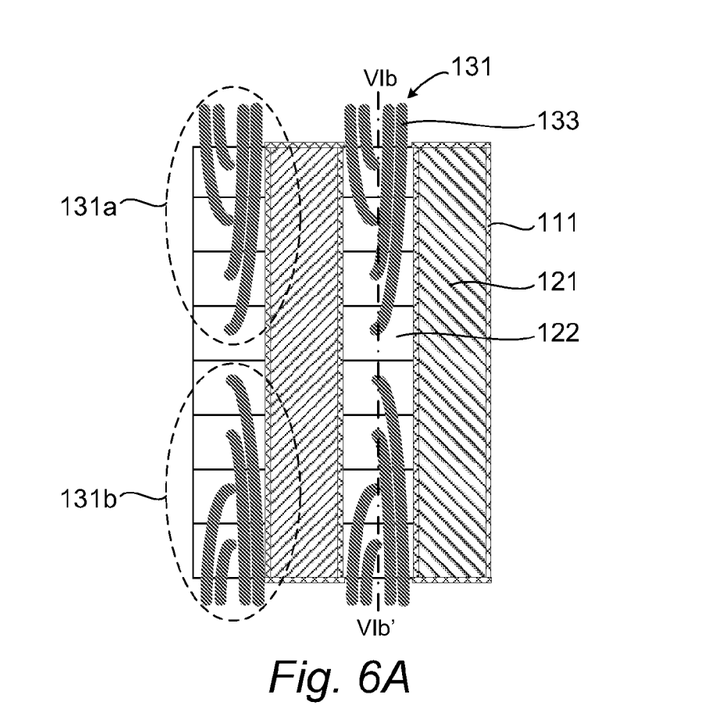
FIG. 6A schematically shows an optical fiber arrangement on top of the beamlet blanker array of FIG. 5.

FIG. 6A schematically shows an exemplary embodiment of an optical fiber arrangement 131 selectively placed over the beamlet blanker array 9 of FIG. 5. The optical fiber arrangement 131 comprises a plurality of optical fibers 133 arranged to guide pattern data carrying light beams towards the light sensitive elements within the non-beam areas 122. The fibers 133 are positioned such that they do not hinder a passage of charged particle beamlets arranged to pass through the apertures within the beam area 121 of the beamlet blanker array 9.

The exemplary optical fiber arrangement 131 of FIG. 6A comprises two portions per non-beam area 122. A first portion 131a comprises a number of fibers 133 that enter a space above the non-beam area 122 from one side, while the second portion 131b comprises a number of fibers 133 entering the space above the non-beam area 122 at an opposing side. The number of fibers 133 within each portion 131a, 131b may be equal to each other. The use of different portions allows for more space per fiber 133, and reduces the risk of damaging the fibers 133.

Figure 6B:
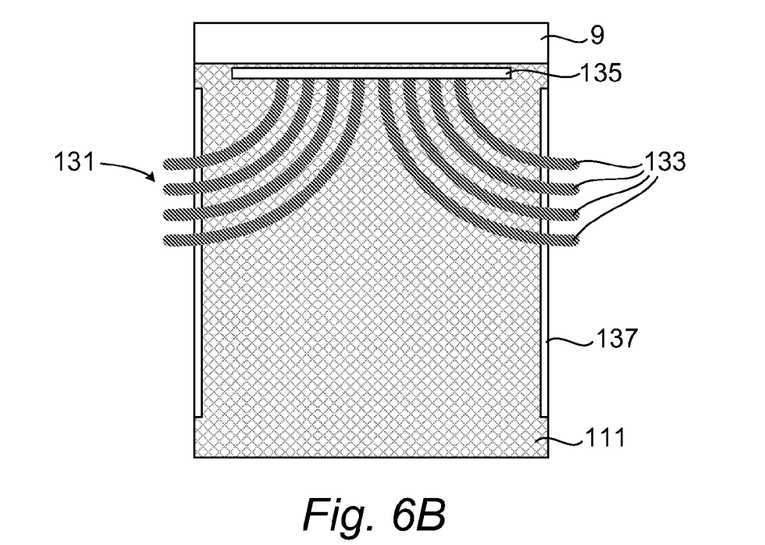
FIG. 6B schematically shows a cross-sectional view of the arrangement shown in FIG. 6A along the line VIB-VIB'.

FIG. 6B schematically shows a cross-sectional view of the arrangement shown in FIG. 6A along the line VIB-VIB'. The fibers 133 within the arrangement 131 terminate in a fiber array 135. The ends of the fibers within the fiber array 135 are directed towards the light sensitive elements (not shown) within the non-beam area of the beamlet blanker array 9. The fiber array 135 is preferably placed in close proximity of the surface of the beamlet blanker array 9 to minimize alignment errors due to poorly oriented fibers 133 within the fiber array 135.

The use of a complete enclosure embracing the non-beam area provides an effective shield for electric fields originating from locations within the non-beam area. As can be seen in FIG. 6B, in this embodiment one or more small openings 137 in the wall 111' are provided to allow the introduction of the fibers within this enclosure. For shielding reasons, the cross-sectional area of these openings 137 is preferably as small as possible. The use of portions may help to reduce the dimensions of the cross-sectional area in a direction substantially perpendicular to the surface of the fiber array. However, to avoid damage to the fibers due to friction and/or strain the cross-sectional area of the openings 137 may be chosen somewhat larger.

Figure 6C:
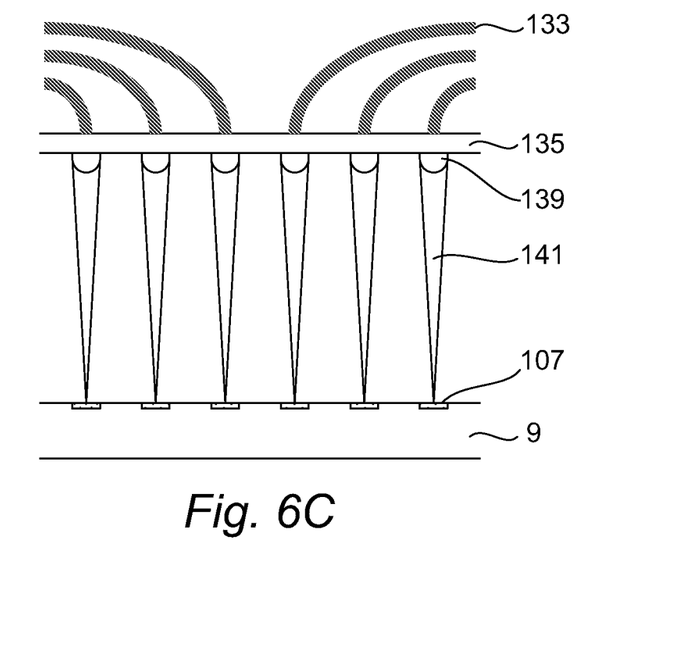
FIG. 6C schematically shows a more detailed view of the alignment of the optical fiber arrangement of FIGS. 6A, 6B.

FIG. 6C schematically shows a more detailed view of alignment of the optical fiber arrangement of FIGS. 6A, 6B. As can be seen in FIG. 6C, the fibers 133 within the fiber array 135 are substantially aligned with corresponding light sensitive elements 107 located in the non-beam area of the beamlet blanker array 9.

In the embodiment shown in FIG. 6C, the fiber array 135 includes an array of microlenses 139. The use of microlenses 139 improves optical communication. The microlenses 139 are arranged to focus light leaving the respective fibers 133 onto the light sensitive element 107. The microlenses 139 thus reduce the spot size of the light beam at the light receiving surface of the light sensitive element 107. The use of microlenses alleviates alignment requirements between fiber array 135 and the light sensitive elements 107. A small deviation of the reduced spot size can still be handled by the light sensitive element because most, if not all, light leaving the respective fiber 133 still falls onto its light receiving surface.

Instead of using microlenses 139 the fiber array 135 may be placed in close proximity of the light sensitive elements 107 to achieve communication with reduced light loss. Such embodiment has the advantage that it is less complex due to the absence of the microlenses 139.

Figure 7:
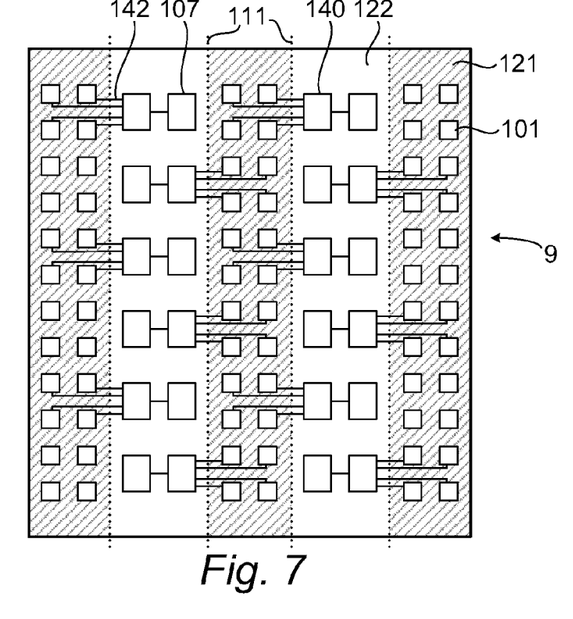
FIG. 7 schematically shows a top view of a topographic arrangement of a beamlet blanker array according to an embodiment of the invention.

FIG. 7 schematically shows a top view of a topographic arrangement of a beamlet blanker array according to an embodiment of the invention. The beamlet blanker array 9 is again divided in beam areas 121 and non-beam areas 122. In FIG. 7, the beam areas 121 and the non-beam areas 122 are separated by walls forming a shielding structure 111 as discussed earlier.

The beam areas 121 comprise a plurality of modulators 101. The non-beam areas 122 comprise a plurality of light sensitive elements 107. Suitable examples of the light sensitive elements 107 include but are not limited to photodiodes and phototransistors.

The non-beam areas 122 further include demultiplexers 140. In this embodiment, the light signals received by the light sensitive elements 107 are multiplexed signals which include information for more than one modulator 101. A signal received by a light sensitive element 107 is transferred to a demultiplexer 140. The demultiplexer 140 demultiplexes the signal and forwards demultiplexed signals to the correct modulators 101 via dedicated electrical connections 142.

As a result of multiplexed light signals, demultiplexers 140 and demultiplexed electrical signals, the number of light sensitive elements 107 is lower than the number of modulators 101. Having a limited number of light sensitive elements 107 enables reduction of the dimensions of the non-beam areas 122. The beam areas 121 may then be placed more closely together to increase the number of modulators 101 per unit area in the blanker array 9. In comparison to a non-multiplexed embodiment the lay-out of the beamlet blanker array 9 would then be more compact if the same number of modulators 101 would be used. If the dimensions of the blanker array 9 would remain substantially the same, more modulators could be used. Alternatively, instead of decreasing the size of the non-beam areas 122 the use of a multiplexed embodiment as shown in FIG. 7 could enable the use of light sensitive elements 107 with a greater light receiving area. The use of a greater light receiving area per light sensitive element 107 reduces the complexity of the optics needed to direct the light signal towards the correct light sensitive elements 107 and may alleviate requirements related to the alignment of light beams and light sensitive elements 107.

Figure 8:
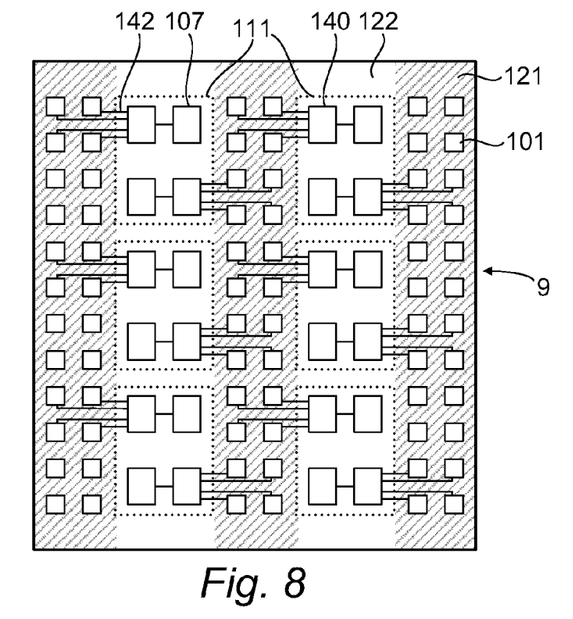
FIG. 8 schematically shows a top view of a topographic arrangement of a beamlet blanker array according to another embodiment of the invention.

FIG. 8 schematically shows a top view of a topographic arrangement of a beamlet blanker array 9 according to another embodiment of the invention. In contrast to the embodiment shown in FIG. 7, the shielding structure 111 now embraces a portion of the light sensitive elements 107 and the demultiplexers 142 within a non-beam area 122. This modular approach has the advantage that malfunctioning channels and/or components like demultiplexers 142 can be more easily corrected for.

Figure 9:
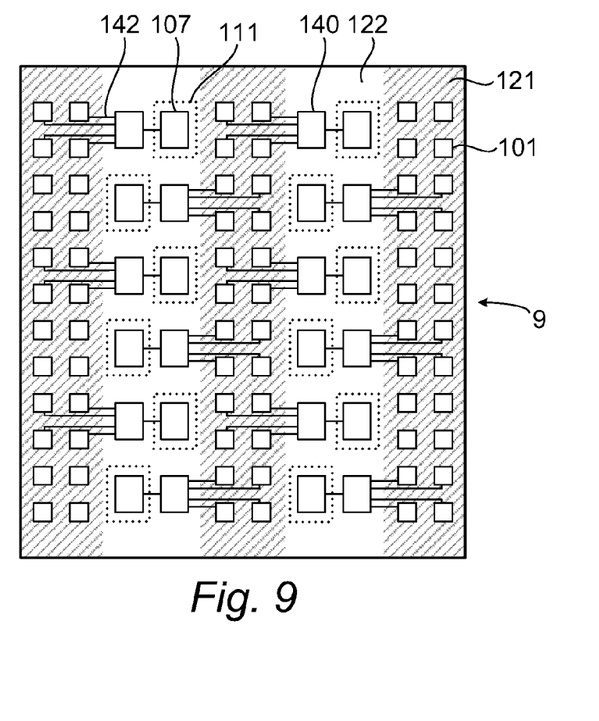
FIG. 9 schematically shows a top view of a topographic arrangement of a beamlet blanker array according to yet another embodiment of the invention.

FIG. 9 schematically shows a top view of a topographic arrangement of a beamlet blanker array 9 according to yet another embodiment of the invention. In contrast to the embodiment shown in FIG. 8, the shielding structure 111 now merely embraces the light sensitive elements 107 within a non-beam area 122.

Note that, although the preceding embodiments, in particular the embodiments described with reference to FIGS. 6A-6C, were directed to transfer of pattern data carrying light beams towards a location in proximity of the light sensitive elements via optical fibers, it may be equally possible to use free space optics, in particular in the area close to the beamlet blanker array. The use of free space optics has the advantage that no space needs to be reserved for the accommodation of fibers. Furthermore, different light paths may be created by using optical elements like mirrors. The use of optical elements in free space optics increases the flexibility of forming light paths. The mechanical limitations of optical fibers, for example a limited ability to bend in a small space, play no role.

Figure 10:
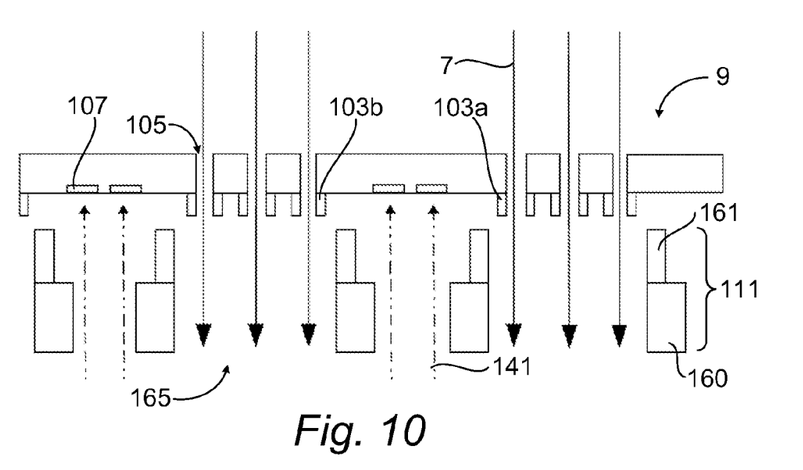
FIG. 10 schematically shows a cross-sectional view of a beamlet blanker array with an embodiment of a shielding structure.

FIG. 10 schematically shows a cross-sectional view of a beamlet blanker array 9 with an embodiment of a shielding structure 111 using free space optics. The light beams 141, indicated herein with dashed-dotted arrows have an incident angle of approximately 90 degrees. Note that this is not essential.

The particular embodiment of the shielding structure 111 shown in FIG. 10 includes a substrate 160 provided with side walls 161 extending thereon. The side walls 161 are located adjacent to apertures 165 within the substrate 160 that are aligned with one or more apertures 105 within the beamlets blanker array 9. Note that although the beamlets 7 in FIG. 10 pass the beamlet array 9 substantially perpendicular, this is not essential.

The side walls 161 are suitably made of conductive material. In some embodiments, a side wall 161 is arranged circumferentially around an aperture 165. In some other embodiments, a side wall 161 is arranged circumferentially around a lateral area defined by the one or more light sensitive elements 107. In such case, a structure of side walls 161 may be provided, including a side wall extending around the lateral area of light sensitive elements and a side wall extending around the aperture 165. The shielding structure 111 does not have to be sealed to the beamlet blanker array 9.

The embodiment of the shielding structure 111 is in particular suitable for a topographical arrangement as schematically shown in FIG. 7. The long extension of the side walls in one direction (in FIG. 7 a vertical direction), height requirements of the shielding structure 111 do not have a significant effect on the angle at which the data carrying light beams can be directed onto the light sensitive elements 107. In particular, if a design is used where the height of the shielding structure is substantially greater than the lateral shielding distance introducing the light from directions with a significant component substantially perpendicular to the direction of the walls forming the shielding structure limits the angle at which light can reach the light sensitive elements 107.

The long extension of the shielded area in the direction of the side walls forming the shielding structure 111 now ensures that such limited possible entry of light beams only occurs if the beams originate from a direction with a significant component substantially perpendicular to the side wall orientation. The angles at which light can couple into the shielded area when incident from a direction substantially parallel to the side wall orientation may vary widely as no significant shielding is needed in these directions.

Figure 11:
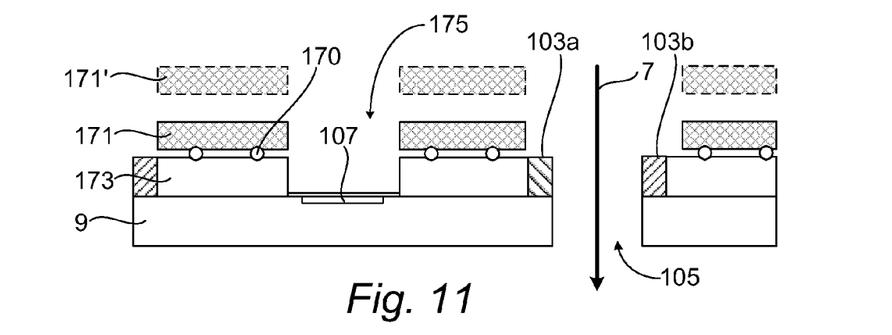
FIG. 11 schematically shows a cross-sectional view of a beamlet blanker array with an embodiment of a shielding structure.

As mentioned earlier, the shielding structure 111 does not necessarily be physically connected to the beamlet blanker array 9. However, in some embodiments both structures are connected. For example, FIG. 11 shows an embodiment in which the shielding structure 111 is connected to the blanker array 9 using solder balls 170. The solder balls 170 may extend through a passivation layer (not shown) that is commonly used in IC manufacturing. The use of such soldering connection may be particularly suitable for embodiments of the shielding structure 111 that embrace a relatively small area, for example embodiments having a topographical arrangement as shown in FIGS. 8 and 9.

Furthermore, in the embodiments shown above, the shielding structure 111 is a wall-like structure having a height that is at least similar in dimensions to the lateral shielding distance. However, in some applications is may be sufficient to use a shielding structure 111 comprising a plate 171 with apertures 175. Some apertures are aligned with the apertures 105 within the beamlet blanker array 9 while others are aligned with the light sensitive elements 107 to allow illumination of these elements by the data carrying light beams (not shown).

The embodiment shown in FIG. 11 includes a beamlet blanker array 9 provided with an interconnect structure 173 arranged to enable connection of light sensitive elements 107 at different levels with the electrostatic deflectors 103a, 103b of the modulators 105. Such multi-level connection structure may reduce the modulator pitch within the beamlet blanker array 9, which can result in a more compact design.

The plate 171 may be physically connected to the beamlet blanker array 9, for example via solder balls 170, but may also be positioned at some distance, indicated in FIG. 11 by structure 171' provided with dashed contour lines. In such case, the beamlet blanker array 9 and the structure 171' may be connected to the same frame to ensure that both structures are suitably aligned with respect to each other. The distance between the structure 171' and the blanker array 9 may be suitably designed based on the desired extent of electric field shielding and the available angle for data carrying light beams to "hit" the light sensitive elements 107.

The plate 171, 171' may be a metal piece in which the apertures are shaped by punching. An example of such piece is referred to in the semiconductor industry as a leadframe. Alternatively, the plate 171, 171' may take the form of a semiconductor or ceramic substrate provided with through-holes, for example made by using one or more suitable etching techniques.

Note that the direction of the charged particle beamlet 7 is not essential. The embodiment shown in FIG. 11 may also be used while a particle beamlet 7 passes through the aperture 105 in a substantially upward direction.

Figure 12:
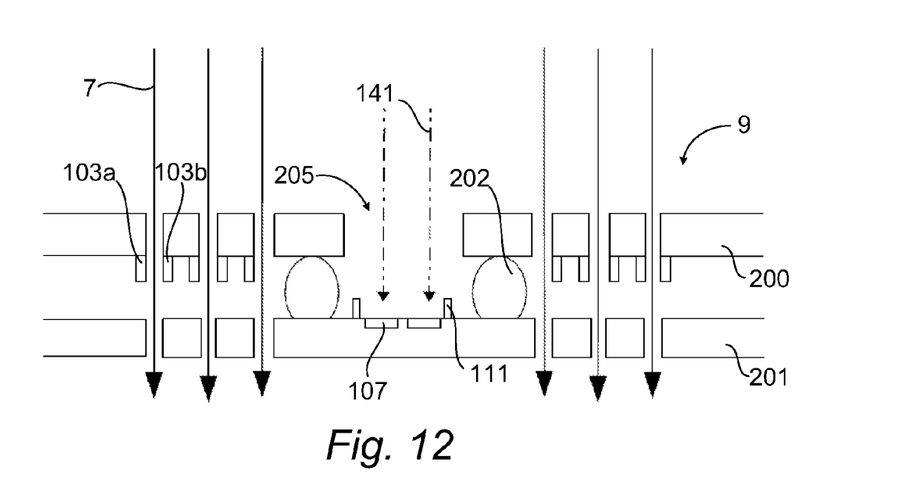
FIG. 12 schematically shows yet another embodiment of a beamlet blanker array provided with a shielding structure.

FIG. 12 shows yet another embodiment of a beamlet blanker array 9 provided with a shielding structure 111. The beamlet blanker array 9 of this embodiment comprises a first substrate 200 and a second substrate 201. The modulators with deflectors 103a, 103b are defined on the first substrate

200. The light sensitive elements 107 are defined at a surface of the second substrate 201. Solder balls 202 provide mechanical connections from the first substrate 200 to the second substrate 201 and electrical connections between the light sensitive elements 107 and the deflectors 103a, 103b, and/or any intermediate circuitry. Light beams 141 now arrive at the light sensitive elements 107 from an opposite direction, e.g. the top side of the column. Thereto, radiation apertures 205 are present in the first substrate 200. In the shown embodiment the shielding structure 111 is connected to the second substrate 201, and takes the form of side walls. The side walls may extend in a single direction (see e.g. topographic arrangement of FIG. 7) or may embrace one or more light sensitive elements 107 (see e.g. topographic arrangements of FIGS. 8 and 9).

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

What is claimed is:

1. A charged-particle multi-beamlet lithography system for transferring a pattern onto the surface of a target using a plurality of charged particle beamlets, the system comprising:
    a beam generator for generating a plurality of charged particle beamlets;
    a beamlet blanker array for patterning the plurality of beamlets in accordance with a pattern; wherein the beamlet blanker array comprises a plurality of modulators and a plurality of light sensitive elements, the light sensitive elements being arranged to receive pattern data carrying light beams and to convert the light beams into electrical signals, the light sensitive elements being electrically connected to one or more modulators for providing the received pattern data to the one or more modulators;
    a shielding structure of an electrically conductive material for substantially shielding electric fields generated in proximity to the light sensitive elements from the modulators, wherein the shielding structure is arranged to be set at a predetermined potential; and
    a projection system for projecting the patterned beamlets onto the target surface;
        wherein the beamlet blanker array comprises a substrate provided with a surface being subdivided into a plurality of alternating beam areas and non-beam areas, the modulators being located in the beam areas and each beam area comprising a plurality of modulators, and the light sensitive elements being located in the non-beam areas and each non-beam area comprising a plurality of light sensitive elements; and
        wherein the shielding structure is arranged to enclose the plurality of modulators in each beam area or the plurality of light sensitive elements in each non-beam area so that the projection of the shielding structure onto the beamlet blanker array forms a boundary between adjacent beam and non-beam areas to shield the modulators in the beam areas from electric fields generated in the non-beam areas.

2. The system of claim 1, wherein the beam area and the non-beam area take the form of adjacent strips, and the shielding structure comprises a wall having a length and a height, which projection onto the substrate surface of the beamlet blanker array in a direction substantially parallel to the wall height and substantially perpendicular to the wall length separates the beam area from the non-beam area.

3. The system of claim 1, wherein the shielding structure comprises side walls forming an open-ended box-like structure.

4. The system of claim 3, wherein a first end of the open-ended box-like structure faces towards the substrate surface of the beamlet blanker array and an opposing second end of the open-ended box like structure faces away from the beamlet blanker array.

5. The system of claim 3, wherein the volume embraced by the shielding structure comprises one or more optical elements for guiding the pattern data carrying light beams to the light sensitive elements.

6. The system of claim 5, wherein the one or more optical elements comprise an array of optical fibers.

7. The system of claim 6, wherein the optical elements further comprise an array of microlenses, the microlenses corresponding to one or more fibers within the fiber array.

8. The system of claim 3, wherein at least one of the side walls is arranged for introducing the pattern data carrying light beams into the volume embraced by the shielding structure.

9. The system of claim 8, wherein at least one of the side walls of the shielding structure comprises an opening for accommodating entry of optical fibers into the volume embraced by the shielding structure.

10. The system of claim 8, wherein at least one of the side walls of the shielding structure comprises a portion that is transparent for light of the pattern data carrying light beams.

11. The system of claim 3, wherein the ratio between the height of the shielding structure and the distance between a light sensitive element and the perpendicular projection of the closest side wall of the shielding structure onto the beamlet blanker array is greater than about 1.

12. The system of claim 1, wherein the light sensitive elements are provided with an anti-reflection coating.

13. The system of claim 3, wherein the ratio between the height of the shielding structure and the distance between a light sensitive element and the perpendicular projection of the closest side wall of the shielding structure onto the beamlet blanker array is greater than about 2.5.

14. The system of claim 1, wherein the predetermined potential is ground potential.

15. The system of claim 1, wherein each of the modulators comprise a first electrode, a second electrode and an aperture, and wherein the electrodes are located on opposing sides of the apertures for generating an electric field across the aperture.

16. A modulation device for use in a charged-particle multi-beamlet lithography system, the modulation device comprising:
    a beamlet blanker array for patterning a plurality of beamlets in accordance with a pattern, wherein the beamlet blanker array comprising a plurality of modulators and a plurality of light sensitive elements, the light sensitive elements being arranged to receive pattern data carrying light beams and being electrically connected to one or more modulators for providing the received pattern data, and the modulators being arranged to modulate charged particle beamlets in accordance with the received pattern data; and
    a shielding structure of an electrically conductive material for substantially shielding electric fields generated in proximity to the light sensitive elements from the modulators, wherein the shielding structure is arranged to be set at a predetermined potential;

wherein the beamlet blanker array comprises a substrate provided with a surface being subdivided into a plurality of alternating beam areas and non-beam areas, the modulators being located in the beam areas and each beam area comprising a plurality of modulators, and the light sensitive elements being located in the non-beam areas and each non-beam area comprising a plurality of light sensitive elements; and wherein the shielding structure is arranged to enclose the plurality of modulators in each beam area or the plurality of light sensitive elements in each non-beam area so that the projection of the shielding structure onto the beamlet blanker array forms a boundary between adjacent beam and non-beam areas to shield the modulators in the beam areas from electric fields generated in the non-beam areas.

17. The device of claim 16, wherein a modulator of the plurality of modulators comprises a first electrode, a second electrode and an aperture, the electrodes being located on opposing sides of the apertures for generating an electric field across the aperture.

18. The device of claim 16, wherein the beam area and the non-beam area take the form of adjacent strips, and the shielding structure comprises a wall having a length and a height, which projection onto the substrate surface of the beamlet blanker array in a direction substantially parallel to the wall height and substantially perpendicular to the wall length separates the beam area from the non-beam area.

19. The device of claim 16, wherein the shielding structure comprises side walls forming an open-ended box-like structure.

20. The device of claim 19, wherein the volume embraced by the shielding structure comprises one or more optical elements for guiding the pattern data carrying light beams to the light sensitive elements.

21. The device of claim 20, wherein the one or more optical elements comprise an array of optical fibers.

22. The device of claim 21, wherein the optical elements further comprise an array of microlenses, each microlens corresponding to one or more fibers within the fiber array.

23. A method of modulating charged particle beamlets in a charged-particle multi-beamlet lithography system for transferring a pattern to a target surface, the method comprising:

providing a beamlet blanker array comprising a plurality of modulators and a plurality of light sensitive elements, the light sensitive elements being arranged to receive pattern data carrying light beams and being electrically connected to one or more modulators for providing the received pattern data, wherein the modulators comprise a first electrode, a second electrode and an aperture, the electrodes being located on opposing sides of the apertures for generating an electric field across the aperture, and wherein the beamlet blanker array comprises a substrate provided with a surface being subdivided into a plurality of alternating beam areas and non-beam areas, the modulators being located in the beam areas and each beam area comprising a plurality of modulators, and the light sensitive elements being located in the non-beam areas and each non-beam area comprising a plurality of light sensitive elements;

transmitting pattern data to the beamlet blanker array;

modulating beamlets passing through the beamlet blanker array in accordance with the pattern data; and shielding the electric fields generated by the modulators in the beam areas for modulating the beamlets from electric fields generated in proximity to the light sensitive elements in the non-beam areas with a shielding structure arranged to enclose the plurality of modulators in each beam area or the plurality of light sensitive elements in each non-beam area so that the projection of the shielding structure onto the beamlet blanker array forms a boundary between adjacent beam and non-beam areas.

* * * * *